United States Patent
Navet

(10) Patent No.: US 8,035,454 B2
(45) Date of Patent: Oct. 11, 2011

(54) OSCILLATOR DEVICE COMPRISING A THERMALLY-CONTROLLED PIEZOELECTRIC RESONATOR

(75) Inventor: Jean-Marc Navet, Moutier (CH)

(73) Assignee: Micro Crystal AG, Grenchen (CH)

( * ) Notice: Subject to any disclaimer, the term of this patent is extended or adjusted under 35 U.S.C. 154(b) by 55 days.

(21) Appl. No.: 12/400,619

(22) Filed: Mar. 9, 2009

(65) Prior Publication Data

US 2010/0225405 A1 Sep. 9, 2010

(51) Int. Cl.
*H04L 1/04* (2006.01)
*H03B 5/32* (2006.01)
*H01L 41/053* (2006.01)

(52) U.S. Cl. ......... 331/69; 331/70; 331/108 C; 331/158; 310/343; 310/344; 310/346; 310/348

(58) Field of Classification Search .............. 331/68–70, 331/108 C, 108 D, 116 FE, 116 R, 154, 158; 310/311, 341, 343, 344, 346, 348, 349, 351, 310/365, 366
See application file for complete search history.

(56) References Cited

U.S. PATENT DOCUMENTS

| | | | |
|---|---|---|---|
| 4,719,384 A * | 1/1988 | Hauden et al. | 310/343 |
| 5,283,458 A | 2/1994 | Stokes et al. | |
| 5,912,592 A * | 6/1999 | Kikushima | 331/68 |
| 5,917,272 A | 6/1999 | Clark et al. | |
| 6,501,340 B1 * | 12/2002 | Flood | 331/69 |
| 7,023,291 B2 * | 4/2006 | Kato et al. | 331/158 |
| 7,345,552 B2 * | 3/2008 | Ito et al. | 331/69 |
| 7,382,204 B2 * | 6/2008 | Arai et al. | 331/69 |
| 7,471,162 B2 * | 12/2008 | Ishikawa et al. | 331/68 |
| 7,514,852 B2 * | 4/2009 | Kasahara et al. | 310/343 |

OTHER PUBLICATIONS

Hyunsoo, Kim et al., "Frame Enclosed Resonator for Miniature Oven Controlled Crystal Oscillator (OCXO)," International Frequency Control Symposium and Exposition, 2006 IEEE, IEEE, PI, Jun. 1, 2006, pp. 491-493.
Hyunsoo, Kim et al., "Direct mounting of quart crystal on a CMOS PLL chip," Frequency Control Symposium and Exposition, 2004. Proceedings of the 2004 IEEE International Montreal, Canada, Aug. 23-27, 2004. pp. 165-168.
Search Report issued in corresponding application No. EP 09154670, completed Aug. 13, 2009 and mailed Aug. 21, 2009.

* cited by examiner

*Primary Examiner* — Levi Gannon
(74) *Attorney, Agent, or Firm* — Griffin & Szipl, P.C.

(57) ABSTRACT

The crystal oscillator device includes an air-tight case (1) forming a vacuum chamber (23), a piezoelectric resonator element (11), oscillation circuitry, a temperature sensor, and a heating unit implemented in an integrated-circuit (IC) chip (13) with an active surface (13a). The piezoelectric resonator element (11) and the oscillation circuitry are connected together to form an oscillation circuit. Furthermore, the temperature sensor and the heating unit are enclosed in the vacuum chamber (23) with the piezoelectric resonator element (11).
The piezoelectric resonator element is attached in a heat conductive manner to the active surface (13a) of the integrated-circuit chip (13) in such a way that the IC chip provides mechanical support for the piezoelectric resonator element.

19 Claims, 3 Drawing Sheets

OSCILLATOR DEVICE COMPRISING A THERMALLY-CONTROLLED PIEZOELECTRIC RESONATOR

FIELD OF THE INVENTION

The invention relates to a small-sized oscillator device comprising a piezoelectric resonator element. The invention more particularly relates to such an oscillator device capable of maintaining its piezoelectric resonator element at a substantially constant temperature.

BACKGROUND OF THE INVENTION

Small-sized crystal oscillator devices are most often used for making reference frequency generators in particular for electronic equipment, in numerous fields such as horology, information technology, telecommunications, GPS, and the medical field.

Small-sized crystal oscillator devices are often (but not necessarily) SMDs (Surface Mounted Devices). A small-sized surface-mount crystal oscillator device is known, which comprises a container for surface mounting, a piezoelectric resonator element (the crystal), and an integrated circuit chip (IC chip) connected to the piezoelectric resonator element so as to form an oscillation circuit. The IC chip and the piezoelectric resonator element are both arranged inside a hermetically sealed cavity of the container.

The resonator frequency output signal from a crystal oscillator device will generally change as the temperature of the oscillator changes. Various methods are known to neutralize this effect caused by changes in the ambient temperature. For example, crystal oscillator devices are known that comprise an oven for heating the oscillation circuitry and/or the piezoelectric resonator element.

Oven Controlled Crystal Oscillators (OCXO) usually contain a heater and a temperature sensor along with a heating control circuit to control the heater. The heating control circuit controls the power supplied to the heater as a function of ambient temperature. The amount of power supplied changes with ambient temperature, in such a way as to hold the crystal and other critical circuitry at a predetermined constant temperature. This predetermined temperature is usually chosen to be about 10 degrees above the highest expected ambient temperature.

The resonator frequency of a piezoelectric resonator element can generally be approximated by one of either a square or a cubic function of temperature. There is usually at least one stationary point on the curve where the slope of frequency versus temperature is zero. The piezoelectric resonator element should be chosen so that a stationary point coincides with the desired constant temperature of the oven. In this way, inevitable temperature cycling around the predetermined oven temperature will have only a marginal effect on the frequency stability.

In an OCXO, the piezoelectric resonator element is usually enclosed in a case and the entire case is covered by a heater. Such an oven controlled oscillator device has excellent temperature characteristics. However, it also has the disadvantage of large power consumption and long warm-up time. Patent document U.S. Pat. No. 5,917,272 discloses a crystal oscillator device with reduced power consumption. The oscillator device comprises a piezoelectric resonator element mounted in a thermal conductive manner over a heat conductive substrate by means of highly heat conducting support clips. As the support clips are electrically conductive, they also serve to electrically connect the piezoelectric resonator to conducting paths on the surface of the substrate. The heat conductive substrate also carries a heating device, a control circuit and a temperature sensor. The substrate, itself, is mounted in a heat insulating manner inside an airtight package, by means of thermal insulating posts. Electrical leads are further arranged inside the package to connect the substrate to connecting pads which in turn are connected to the exterior. The electrical leads are made of very fine wires in order to limit heat conduction. As the substrate carrying the heating device and the piezoelectric resonator element is reasonably well insulated from the walls of the airtight package, heat dissipation is greatly reduced.

However, such prior art crystal oscillator devices have some problems. Indeed, when the ambient temperature changes, the temperature of the outer surfaces of the device also changes. As the device is at least partially packaged in heat conductive material, the ambient temperature change propagates inwards. As the piezoelectric element lies directly under the cover, a certain amount of heat is susceptible to radiate from the cover to the crystal element or vice versa. Furthermore, the oscillation circuitry is provided outside the package. Therefore, ambient temperature changes can be transmitted to the piezoelectric resonator unit, by heat conduction, through the oscillation circuitry, the electrical leads, and finally the support clips.

Ambient temperature changes must first reach the temperature sensor mounted on the substrate before the control circuit can activate the heater. Since the piezoelectric resonator unit is spaced from the temperature sensor, the rate of temperature change in the two units is different. This can lead to a delay before the temperature control circuit reacts. Furthermore, once the temperature control has reacted, it takes time for the heat produced by the heater to reach the piezoelectric resonator unit. It follows that there is a risk that the temperature of the piezoelectric resonator unit will deviate substantially from the set-point temperature of the device. Therefore, a really stable oscillation can not be guaranteed.

SUMMARY OF THE INVENTION

It is therefore an object of the present invention to provide a crystal oscillator device, which can be made small enough to be compatible with surface mounting techniques (SMD), and which has reduced power consumption and a resonator frequency that is more stable in case of changes in the ambient temperature.

To this end, the crystal oscillator device according to the present invention comprises an air-tight case forming a vacuum chamber, a piezoelectric resonator element, oscillation circuitry, a temperature sensor, and a heating unit implemented in an integrated-circuit chip having an active surface, the piezoelectric resonator element and the oscillation circuitry being connected together to form an oscillation circuit, and the temperature sensor and the integrated-circuit chip being enclosed in the vacuum chamber with the piezoelectric resonator element, characterised in that the piezoelectric resonator element is attached in a heat conductive manner to the active surface of the integrated-circuit chip in such a way that the integrated-circuit chip supports the piezoelectric resonator element.

Here, an "active surface" refers to one of the two major surfaces of the integrated-circuit chip (IC chip), on which electronic circuits such as a heating unit can be formed. IC terminals are also formed on the active surface for connecting the IC chip.

It should further be understood that "piezoelectric resonator element" refers to an uncovered crystal and not to a unit formed by a crystal resonator enclosed in its own casing.

According to the present invention, the heating unit is implemented in the IC chip. An advantage of this arrangement is that the piezoelectric resonator element and the heating unit are located close to each other. This feature contributes to reducing the magnitude of deviations from the set-point temperature of the device.

According to a particular embodiment of the present invention, oscillation circuitry is implemented in the integrated-circuit chip along with the heating unit. In this case, the piezoelectric resonator element is preferably attached to the active surface of the integrated-circuit chip in such a way as to form direct electrical connections with the oscillation circuitry. This arrangement allows dispensing with leads for connecting the piezoelectric resonator element and the oscillation circuitry. Thermal losses from heat conduction are therefore kept at a minimum.

According to another particular embodiment of the present invention, the temperature sensor is implemented in the integrated-circuit chip along with the heating unit (and possibly with oscillation circuitry as well). An advantage of this particular embodiment is that as the temperature sensor and the piezoelectric resonator element are located close to the heating unit, the crystal oscillator device can react very fast to any change in temperature.

BRIEF DESCRIPTION OF THE DRAWINGS

Other features and advantages of the present invention will appear upon reading the following description, given solely by way of non-limiting example, and made with reference to the annexed drawings, in which.

DETAILED DESCRIPTION OF THE INVENTION

Figure 1A:
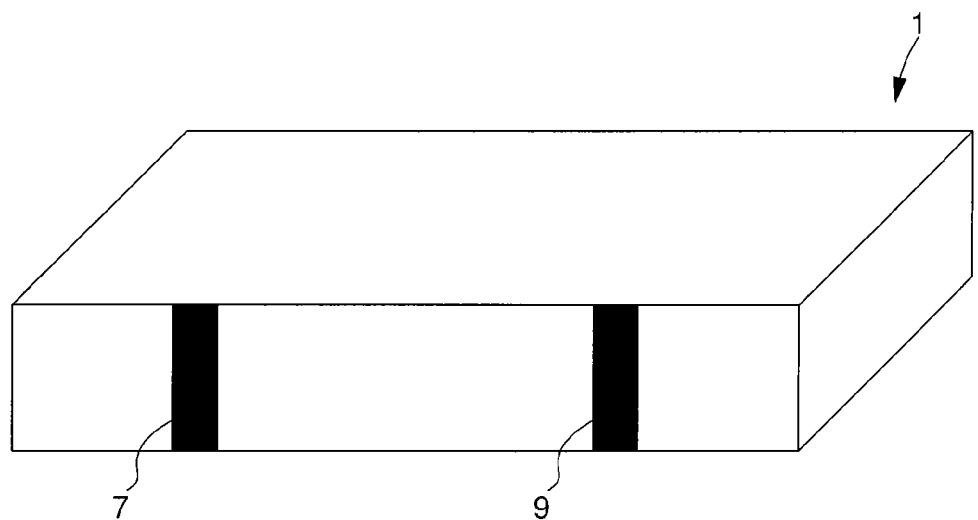
FIG. 1a is a view in perspective of a ceramic case of the surface mounted (SMD) type adapted to package a crystal oscillator device according to the present invention.
Figure 1B:
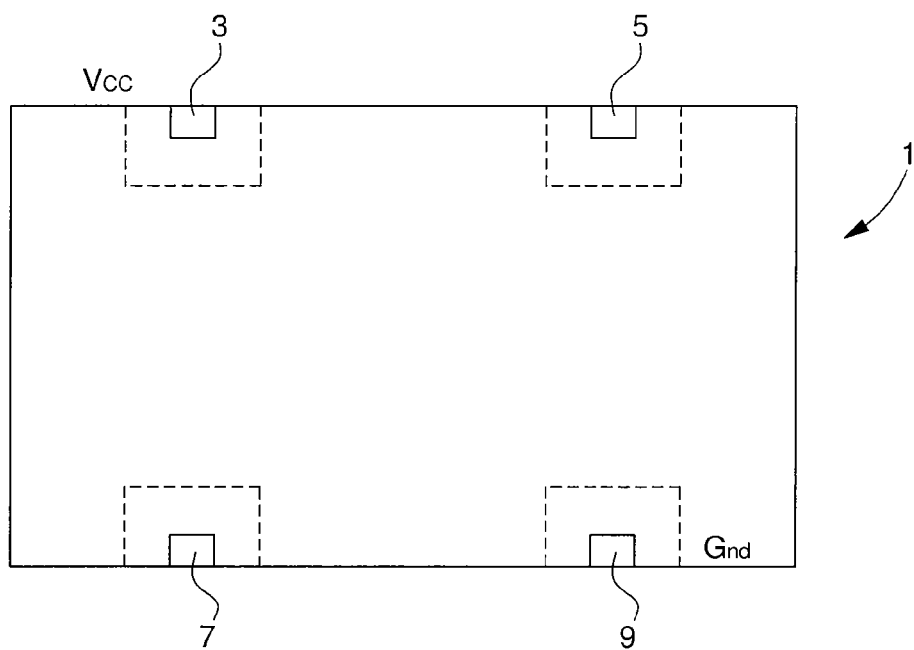
FIG. 1b is schematic illustration of the ceramic case of FIG. 1a showing its four connection pins.

FIGS. 1a and 1b show a ceramic case 1 adapted to package a crystal oscillator device according to the present invention. The illustrated ceramic case is of the surface mounted (SMD) type. The case 1 can have very small dimensions. For example, the case can be the same size as a standard MCSO. That is 14 millimetres long, 9 millimetres wide and 3.2 millimetres high. As more clearly illustrated in the schematic view of FIG. 1b, the case 1 carries four external electrodes (or pins) 3, 5, 7 and 9. These electrodes are arranged to connect the components of the crystal oscillator device inside the case, to an outside circuit (not shown) through the base or the sides of the case. Electrode 3 is arranged to be connected to the supply voltage (Vcc) and electrode 9 is arranged to be connected to ground (Gnd). In a known manner, electrode 7 is arranged to be connected to a control voltage which allows controlling the oscillation frequency. Finally, electrode 5 is the frequency output from the crystal oscillator device.

Figure 2A:
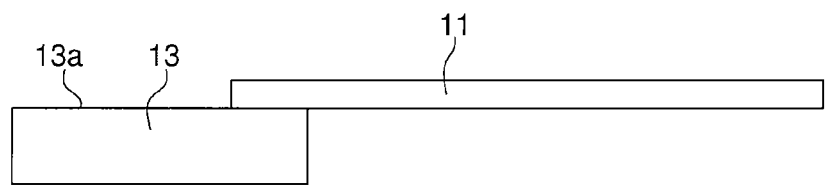
FIG. 2a is a schematic representation of the assembly formed by the IC chip and the piezoelectric resonator unit of a crystal oscillator device according to an exemplary embodiment of the invention.
Figure 2B:
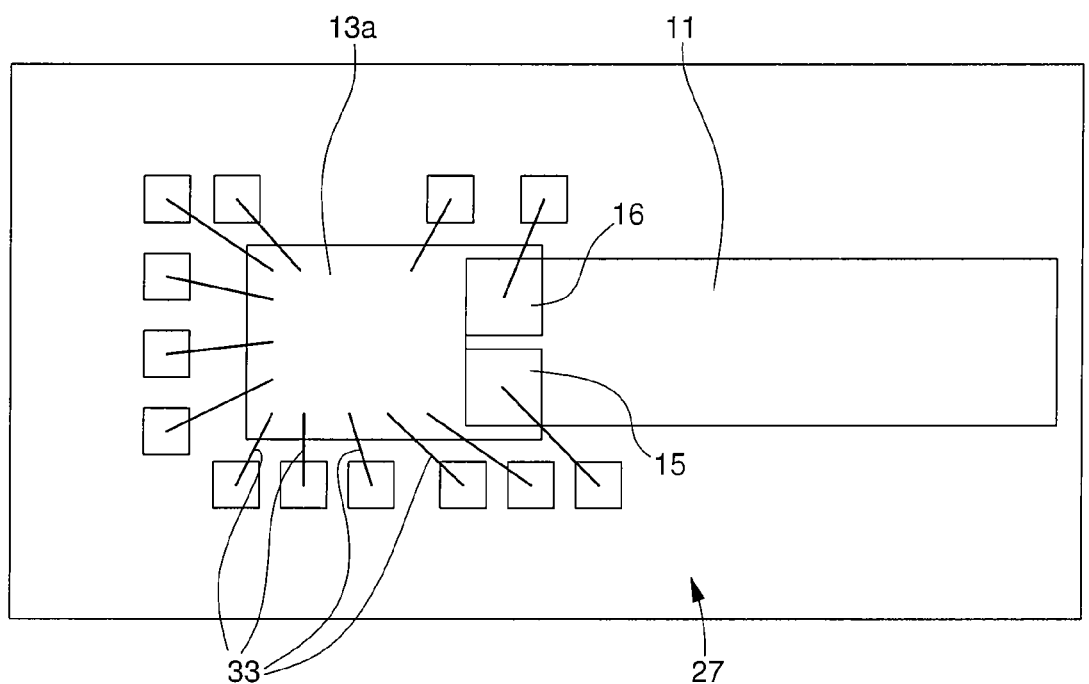
FIG. 2b schematically depicts the assembly of FIG. 2a viewed from above through the lid of the case and showing the electrical connections to and from the IC chip.

FIGS. 2a and 2b show the piezoelectric resonator element 11 with its electrical connections, but without the case 1. In the illustrated example, the piezoelectric resonator element is AT-cut quartz-crystal strip. According to the invention, the piezoelectric resonator unit 11 is mounted on the active surface 13a of an IC chip 13, and a heating unit (not shown) is implemented in the IC chip. In the present example, oscillation circuitry, and a temperature sensor are also implemented in IC chip 13. The oscillation circuitry and the piezoelectric resonator element are connected together so as to form an oscillation circuit.

In a known manner, the surfaces of the piezoelectric resonator element carries metallization arranged to form two electrodes and four connection pads (two of them visible in FIG. 2b being referenced 15 and 16). The connection pads of the resonator are all located at the same end of the crystal strip (two on top and two below), and the electrodes each extend over one of the main surfaces of the strip. Conductive paths further connect each of the electrodes to a pair of connection pads on either main surface of the strip. When one of the electrodes is connected to one pole of the oscillation circuitry and the other electrode is connected to the other pole. A variable electric field can form across the piezoelectric material, between the electrodes, and make the crystal strip vibrate.

As already mentioned, the side of the IC chip 13, onto which the piezoelectric resonator unit 11 is mounted, corresponds to the active surface 13a of the IC chip. In other words, the piezoelectric resonator element 11 is fixed to the particular side of the IC chip on which the electronic circuits are formed. IC terminals (not shown) for connecting the chip are also formed on the active surface. The IC terminals are arranged on the active surface in such a way that, when the piezoelectric resonator element is properly positioned relatively to the IC chip, two IC terminals connected to the integrated oscillation circuitry directly face the two connection pads formed on the bottom surface of the crystal strip 11. This arrangement allows for directly connecting the piezoelectric resonator element to the oscillation circuitry without the need for electrical leads. The connective bonding between the resonator and the IC can be achieved, for example, by ultrasonic flip chip bonding or simply by using a dab of conductive glue for each of the connection pads. One will understand that bonding the resonator to the IC chip in the manner just described has the advantage of providing adequate mechanical support for the resonator as well as providing thermal and electrical conductivity between the two components.

It is often not practical to integrate every single component of the electronic circuitry for the crystal oscillator device. This is the reason why FIG. 2b shows a number of electrical leads (all of them referenced 33) extending from the IC chip and two more electrical leads extending from the two connection pads 15, 16 on the top surface of the crystal resonator. In this particular example, the two latter leads are arranged to connect the resonator input and output to input and output capacitors respectively (the capacitors are not shown). Four electrical leads 33 extending from the IC chip are provided to connect respective IC terminals to the four external pins 3, 5, 7 and 9 of the device (shown in FIG. 1b). The remaining electrical leads 33 are used two connect respective terminals of the IC chip to a decoupling capacitor for the power supply (not shown), to a large capacitor (not shown) for the heating unit, to a resistor and a varicap (not shown) for controlling the oscillation frequency based on the control voltage supplied via external electrode 7 (FIG. 1*b*), and to a resistor (not shown) for adjusting the drive level of the resonator. In order to improve thermal insulation, it is generally preferable that all the above resistors and capacitors be enclosed in the vacuum chamber along with the IC chip. The way in which each individual component is connected to the IC chip will not be explained in any further details. Indeed, a person with ordinary skill in the will have no problem to think of an adequate way to connect these components.

As previously stated, according to the illustrated example, the oscillation circuitry and the temperature sensor are implemented in the IC chip 13 along with the heating unit. However, according to the invention, the only part of the electronic circuitry that must necessarily be implemented in the IC chip 13 is the heating unit. Therefore, according to alternative embodiments, not only large capacitors and resistors, but practically the entire electronic circuitry could possibly be implemented in the form of separate units.

Figure 3:
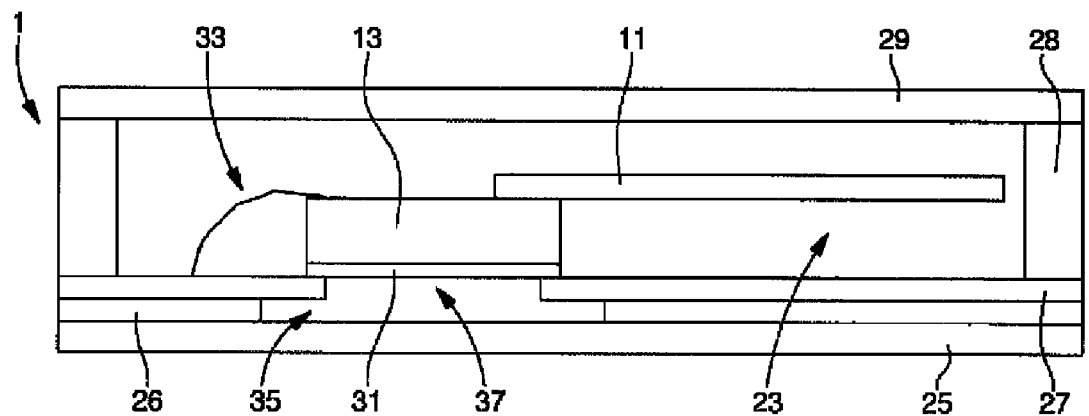
FIG. 3 is cross-sectional view showing the piezoelectric resonator unit and the IC chip inside the vacuum chamber of the ceramic case of FIG. 1.

FIG. 3 is a cross-sectional view showing how IC chip 13 and piezoelectric resonator element 11 are arranged inside ceramic case 1. In this particular example, the case 1 is formed of five layers 25, 26, 27, 28 and 29 of ceramic material. A large vacuum chamber 23 is provided for housing the IC chip 13, the piezoelectric resonator element 11, and all the other abovementioned circuit components. The vacuum chamber 23 is provided inside a three level assembly formed by a support plate 27, a peripheral wall 28 and a lid 29. The ceramic layers are attached to each other in an air tight manner. A person with ordinary skill in the art knows of adequate methods for attaching the ceramic layers. As shown in FIG. 3, the IC chip is fixedly mounted on support plate 27. As ceramic material is thermally conductive, a shoe 31 formed from a layer of thermally insulating material is preferably inserted between the IC chip and the support plate. As previously explained, a number of thin electrical leads 33 (only one being shown in FIG. 3) provide the necessary connections for the IC chip 13 via connecting pads (not shown) on the inside the ceramic case 1.

In order to further improve thermal insulation for the crystal oscillator device, the three layers of ceramic 27, 28, 29 enclosing the vacuum chamber 23 are mounted on top of a base structure formed by a ceramic base plate 25 and an intermediate plate 26. Furthermore, as shown in FIG. 3, a lower cavity 35 is provided in the base, under the support-plate 27, immediately across from the integrated-circuit chip 13. As can further be seen in FIG. 3, the lower cavity 35 is connected to the vacuum chamber 23 by a hole 37 in the support-plate 27, and the IC chip 13 is mounted on the support-plate 27 in such a way as to bridge the hole 37. In this way, the IC chip is practically surrounded by vacuum on all sides. One will understand that this arrangement considerably limits the paths available for heat conduction, and improves thermal insulation.

Figure 4:
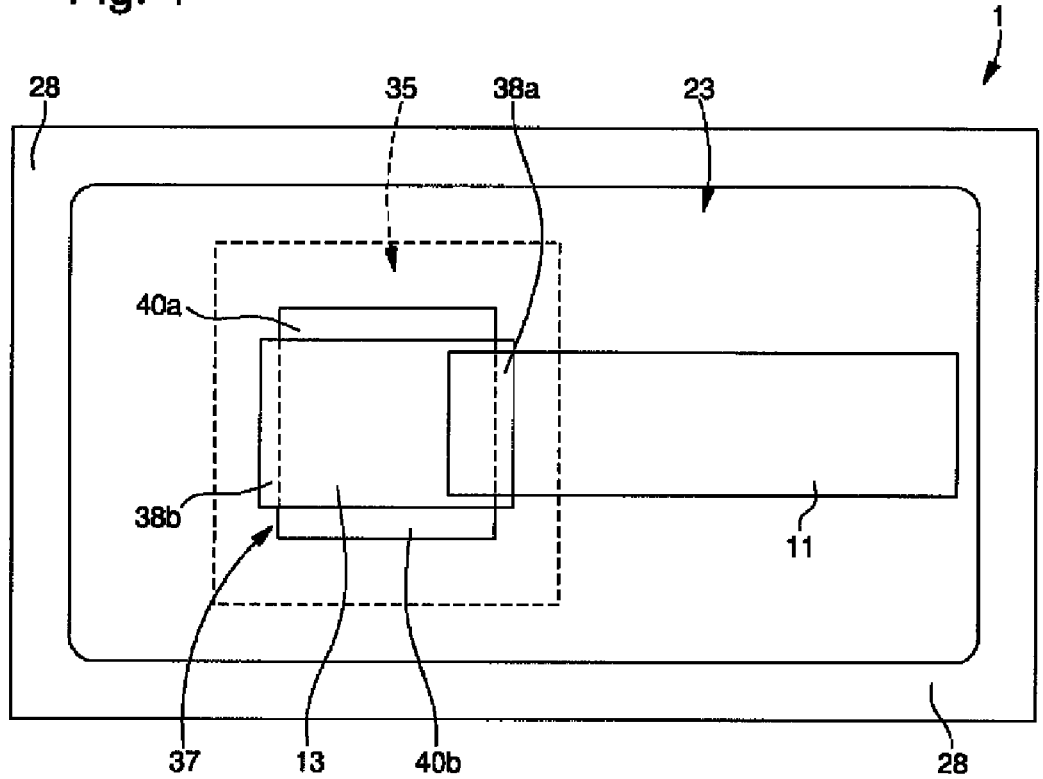
FIG. 4 shows the piezoelectric resonator unit and the IC chip of FIG. 3, from above through the lid of the case, so as to illustrate how the IC chip is mounted over the hole in the support plate.

Referring now to FIG. 4, one can see that the hole 37 is of rectangular shape. Viewed from above, the IC chip 13 has roughly similar dimensions, but is turned by 90° relative to the hole 37. In this configuration, the hole 37 is both wider and shorter than the IC chip 13. When the IC chip 13 bridges the hole 37 as shown in the figures, the contact between the thermally insulating shoe 31 and the support-plate 27 is limited to two narrow strips 38*a* and 38*b* on opposite sides of the hole 37. By limiting the contact area between the shoe 31 and the support-plate 27 to the two narrow strips 38*a*, 38*b*, the described arrangement allows to further limit the transmission of heat from the IC chip to the support-plate. As previously stated, the hole 37 is also wider than the IC chip 13. Therefore, the IC chip does not entirely cover the opening in the support-plate 27. As illustrated in FIG. 4, two narrow openings 40*a*, 40*b* on either side of the IC chip 13 connect the vacuum chamber 23 to the lower cavity 35. This arrangement allows ensuring that when vacuum is created in the vacuum chamber, vacuum is also created in the lower cavity.

It will be understood that various alterations and/or improvements evident to those skilled in the art could be made to the embodiment that forms the subject of this description without departing from the scope of the present invention defined by the annexed claims. In particular, instead of using an AT-cut crystal for the piezoelectric resonator element, it is also possible to use an SC-cut crystal or any other known type of piezoelectric resonator element.

The invention claimed is:

1. A crystal oscillator device, comprising:
an air-tight case forming a vacuum chamber;
a piezoelectric resonator element;
oscillation circuitry;
a temperature sensor; and
a heating unit implemented in an integrated-circuit chip having an active surface, wherein the piezoelectric resonator element and the oscillation circuitry are connected together to form an oscillation circuit, and the temperature sensor and the heating unit are enclosed in the vacuum chamber with the piezoelectric resonator element, wherein the piezoelectric resonator element is attached in a heat conductive manner to the active surface of the integrated-circuit chip so that the integrated-circuit chip supports the piezoelectric resonator element,
wherein the oscillation circuit is implemented in said integrated-circuit chip along with the heating unit, and wherein the piezoelectric resonator element is attached to the active surface of the integrated-circuit chip in such a way as to be directly connected to the oscillation circuitry.

2. The crystal oscillator device according to claim 1, wherein the air-tight case is made out of ceramic.

3. The crystal oscillator device according to claim 1, wherein the case is of the surface-mount type and comprises superposed layers of ceramic.

4. The crystal oscillator device according to claim 1, wherein the temperature sensor is implemented in said integrated-circuit chip along with the heating unit.

5. A crystal oscillator device, comprising:
an air-tight case forming a vacuum chamber;
a piezoelectric resonator element;
oscillation circuitry;
a temperature sensor; and
a heating unit implemented in an integrated-circuit chip having an active surface, wherein the piezoelectric resonator element and the oscillation circuitry are connected together to form an oscillation circuit, and the temperature sensor and the heating unit are enclosed in the vacuum chamber with the piezoelectric resonator element, wherein the piezoelectric resonator element is attached in a heat conductive manner to the active surface of the integrated-circuit chip so that the integrated-circuit chip supports the piezoelectric resonator element,
wherein the piezoelectric resonator element is attached to the active surface of the integrated-circuit chip by means of heat conducting glue.

6. The crystal oscillator device according to claim 5, wherein the temperature sensor is implemented in said integrated-circuit chip along with the heating unit.

7. The crystal oscillator device according to claim 5, wherein the air-tight case is made out of ceramic.

8. The crystal oscillator device according to claim 5, wherein the case is of the surface-mount type and comprises superposed layers of ceramic.

9. A crystal oscillator device, comprising:
    an air-tight case forming a vacuum chamber;
    a piezoelectric resonator element;
    oscillation circuitry;
    a temperature sensor; and
    a heating unit implemented in an integrated-circuit chip having an active surface, wherein the piezoelectric resonator element and the oscillation circuitry are connected together to form an oscillation circuit, and the temperature sensor and the heating unit are enclosed in the vacuum chamber with the piezoelectric resonator element, wherein the piezoelectric resonator element is attached in a heat conductive manner to the active surface of the integrated-circuit chip so that the integrated-circuit chip supports the piezoelectric resonator element,
    wherein the integrated circuit chip and the piezoelectric resonator element are bonded together by means of an ultrasonic flip-chip bonding technique.

10. The crystal oscillator device according to claim 9, wherein the temperature sensor is implemented in said integrated-circuit chip along with the heating unit.

11. The crystal oscillator device according to claim 9, wherein the air-tight case is made out of ceramic.

12. The crystal oscillator device according to claim 9, wherein the case is of the surface-mount type and comprises superposed layers of ceramic.

13. A crystal oscillator device, comprising:
    an air-tight case forming a vacuum chamber;
    a piezoelectric resonator element;
    oscillation circuitry;
    a temperature sensor; and
    a heating unit implemented in an integrated-circuit chip having an active surface, wherein the piezoelectric resonator element and the oscillation circuitry are connected together to form an oscillation circuit, and the temperature sensor and the heating unit are enclosed in the vacuum chamber with the piezoelectric resonator element, wherein the piezoelectric resonator element is attached in a heat conductive manner to the active surface of the integrated-circuit chip so that the integrated-circuit chip supports the piezoelectric resonator element,
    wherein the air-tight case comprises a lid on a top side of the vacuum chamber and a support-plate on a bottom side of the vacuum chamber, wherein the support-plate has two opposite top and bottom surfaces, wherein the integrated-circuit chip is mounted, active surface side-up, on the support-plate, and a thermally insulating material is inserted between the integrated-circuit chip and the support-plate.

14. The crystal oscillator device according to claim 13, wherein the temperature sensor is implemented in said integrated-circuit chip along with the heating unit.

15. The crystal oscillator device according to claim 13, wherein the air-tight case is made out of ceramic.

16. The crystal oscillator device according to claim 13, wherein the case is of the surface-mount type and comprises superposed layers of ceramic.

17. The crystal oscillator device according to claim 13, wherein the support-plate is arranged on a base of the air-tight case, and the air-tight case further comprises a lower cavity arranged inside the base below the support-plate and opposite the integrated-circuit chip.

18. The crystal oscillator device according to claim 17, wherein a hole in the support-plate connects the vacuum chamber and the lower cavity.

19. The crystal oscillator device according to claim 18, wherein the integrated-circuit chip bridges the hole.

* * * * *